(12) United States Patent
Classen

(10) Patent No.: US 9,229,020 B2
(45) Date of Patent: Jan. 5, 2016

(54) MICROPATTERNED COMPONENT AND METHOD FOR MANUFACTURING A MICROPATTERNED COMPONENT

(71) Applicant: Johannes Classen, Reutlingen (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/120,386

(22) Filed: May 14, 2014

(65) Prior Publication Data
US 2014/0339654 A1 Nov. 20, 2014

(30) Foreign Application Priority Data

May 14, 2013 (DE) .......................... 10 2013 208 825

(51) Int. Cl.
| | | |
|---|---|---|
| G01L 1/14 | (2006.01) | |
| G01P 1/00 | (2006.01) | |
| G01P 15/08 | (2006.01) | |
| G01C 19/5755 | (2012.01) | |
| G01P 15/097 | (2006.01) | |
| G01P 15/125 | (2006.01) | |
| B81B 3/00 | (2006.01) | |

(52) U.S. Cl.
CPC ............... *G01P 1/003* (2013.01); *B81B 3/0078* (2013.01); *G01C 19/5755* (2013.01); *G01P 15/0802* (2013.01); *G01P 15/0888* (2013.01); *G01P 15/097* (2013.01); *G01P 15/125* (2013.01); *B81B 2201/0235* (2013.01); *B81B 2201/0242* (2013.01); *B81B 2203/04* (2013.01); *B81B 2203/051* (2013.01); *G01P 2015/088* (2013.01); *G01P 2015/0814* (2013.01); *G01P 2015/0877* (2013.01); *G01P 2015/0882* (2013.01)

(58) Field of Classification Search
CPC ... H01L 29/66007; G01L 1/148; G01P 1/003; G01P 15/0802; G01P 15/0888; G01P 15/097; G01P 15/125; B81B 3/0078
See application file for complete search history.

(56) References Cited

U.S. PATENT DOCUMENTS

| | | | |
|---|---|---|---|
| 8,432,005 B2* | 4/2013 | Yang ....................... H01L 22/12 257/252 |
| 2013/0247666 A1* | 9/2013 | Acar ................... G01C 19/5755 73/514.01 |
| 2013/0334620 A1* | 12/2013 | Chu ....................... B81C 1/00238 257/415 |
| 2014/0227816 A1* | 8/2014 | Zhang ................. B81C 1/00333 438/48 |
| 2015/0061049 A1* | 3/2015 | Weber ..................... G01L 1/148 257/417 |
| 2015/0091911 A1* | 4/2015 | de Groot ................... B81B 5/00 345/501 |
| 2015/0168146 A1* | 6/2015 | Shcheglov ......... G01C 19/5719 73/504.13 |

* cited by examiner

*Primary Examiner* — Michael Shingleton
(74) *Attorney, Agent, or Firm* — Kenyon & Kenyon LLP

(57) ABSTRACT

A micropatterned component, for measuring accelerations and/or yaw rates, including a substrate having a principal plane of extension of the substrate, an electrode, and a further electrode; the electrode having a principal plane of extension of the electrode, and the further electrode having a principal plane of extension of the further electrode; the principal plane of extension of the electrode being set parallelly to a normal direction perpendicular to the principal plane of extension of the substrate; the principal plane of extension of the further electrode being set parallelly to the normal direction; the electrode having an electrode height extending in the normal direction; the electrode having a flow channel extending completely through the electrode in a direction parallel to the principal plane of extension of the substrate; the flow channel having a channel depth extending parallelly to the normal direction; the channel depth being less than the electrode height.

9 Claims, 11 Drawing Sheets

MICROPATTERNED COMPONENT AND METHOD FOR MANUFACTURING A MICROPATTERNED COMPONENT

RELATED APPLICATION INFORMATION

The present application claims priority to and the benefit of German patent application no. 10 2013 208 825.6, which was filed in Germany on May 14, 2013, the disclosure of which is incorporated herein by reference.

FIELD OF THE INVENTION

The present invention is based on a micropatterned component.

BACKGROUND INFORMATION

Such micropatterned components are believed to be generally understood. For example, micropatterned components in the form of micromechanical inertial sensors are mass-produced for measuring accelerations and yaw rates for different applications in the automotive branch and/or in the sale of consumer goods. The inertial sensors normally include electrode set-ups for detecting a change in capacitance, the change in capacitance being a measure of an inertial force acting upon an inertial mass of the inertial sensor. For example, an inertial force may be an accelerative force and/or a Coriolis force of an acceleration sensor and/or of a yaw-rate sensor. The electrode set-up may include, for example, two plate electrodes having respective principal electrode planes of extension positioned in parallel with each other; one of the plate electrodes being able to be excited into a vibration along a vibration direction perpendicular to a principal plane of extension of the electrode. In this connection, the vibration direction may be set, for example, parallelly to a principal plane of extension of a substrate of the micropatterned component.

The electrode set-up is normally situated in a hermetically sealed cavity or hollow space of the micropatterned component; a comparatively lower cavity pressure prevailing in the cavity. With increasing layer thickness or electrode height along a normal direction perpendicular to the principal plane of extension of the substrate, edge flow effects and damping effects, for instance, the so-called squeeze-film damping, have a negative effect on the efficiency, signal noise and/or offset.

SUMMARY OF THE INVENTION

Thus, an object of the present invention is to provide a micropatterned component and a method for manufacturing a micropatterned component, where in the case of a given cavity pressure, damping forces in the electrode set-up are reduced in comparison with the related art and the mechanical efficiency is increased, and/or the electrical sensitivity of the electrode set-up is improved without increasing the damping forces.

In comparison with the related art, the micropatterned component of the present invention and the method of the present invention for manufacturing a micropatterned component according to the alternative independent claims have the advantage that, due to the introduction of one or more flow channels, which each extend completely through the electrode taking the form of, in particular, a plate electrode, in a direction parallel to the principal plane of extension of the substrate and/or perpendicular to the principal plane of extension of the electrode, gas molecules emerging in response to the occurrence of the squeeze-film damping may escape through the flow channels, which means that damping forces acting upon the electrodes are considerably reduced in comparison with electrodes without a flow channel. The forming of the flow channels of the electrode advantageously causes the sensitivity of the electrode set-up, which is also referred to below as a capacitor set-up, to decrease only slightly. A portion of the missing capacitor area is particularly advantageously compensated for by stray-field components from the lateral surfaces of the slotted electrode or electrode having the flow channel. Consequently, the sensitivity of the electrode set-up with regard to the detection of the change in capacitance is improved by increasing the electrode height; the damping effects only increasing slightly or not at all with increasing electrode height. It particular may be the case for the flow channels, which are also referred to here as slots, to completely penetrate the electrode height of the electrode in a direction parallel to the principal plane of extension of the substrate, and in particular, perpendicular to the principal plane of extension of the electrode; in the case of at least two flow channels situated on the electrode, in particular, the channel spacing may be less than the electrode height or equal to the electrode height. The channel depth may extend over more than 50% of the electrode height along the normal direction. As an alternative to a channel depth smaller than the electrode height, the channel depth may be, in particular, equal to the electrode height.

Using a two-stage trenching process of the method according to the present invention, it is also advantageously possible to form a flow channel from the electrode without etching the electrode through the entire layer thickness of the functional layer or through the entire electrode height in the normal direction. In the second production step, during the first time interval, the electrode structure, which includes, in particular, the electrode, the further electrode and/or the inertial structure, is formed from the functional layer, up to a first structural depth. The structural depth, which is also referred to here as a depth of the first trench, is determined by the duration of the first time interval or the first instance of process control, which means that in this instance, there is no defined etch stop. In the third production step, the electrode structure is further etched, but now, the flow channels in the first electrode and/or further electrode additionally being formed or etched. In order to prevent the functional layer from being etched through completely, the third production step is brought to an end in a timely manner after the second time interval, and severe overetching is prevented.

Advantageous embodiments and developments of the present invention may be gathered from the dependent claims and the specification, with reference to the drawing.

According to a further refinement, the channel depth is between 60% and 95%, and may be between 70% and 90%, and particularly may be approximately 80% of the electrode height. In this manner, it is believed to be advantageously possible to form the electrode in one piece to have a comb structure, using the set-up of several flow channels; several tooth-shaped electrode segments, which are referred to as partial electrodes, are perpendicular to the vibration direction and parallel to the principal plane of extension of the substrate, and are spaced apart from one another by the flow channels, being interconnected in an electrically conductive manner. Alternatively, the partial electrodes may be situated, in particular, on a common carrier; the carrier being formed from a further functional layer, which is different from the functional layer from which the electrode is formed.

According to a further refinement, the electrode has a principal direction of extension of the electrode parallel to the principal plane of extension of the electrode and parallel to the principal plane of extension of the substrate; the electrode having several flow channels situated along the principal direction of extension of the electrode; the several flow channels having, in particular, a channel spacing; the channel spacing being, in particular, less than the electrode height. In this manner, it is advantageously possible to provide an improved flow path for the emerging gas molecules resulting from the squeeze-film damping. In particular, it is advantageously possible to provide a flow channel structure extending over all of the electrodes of the electrode set-up.

According to a further refinement, the electrode has a plurality of partial electrodes spaced apart from one another by the several flow channels; the partial electrodes being situated on a common carrier; the electrode being formed from, in particular, a functional layer; the carrier being formed from, in particular, a further functional layer connected to the functional layer. In this manner, it is advantageously possible to provide a space-saving electrode set-up of the micropatterned component that reduces damping forces.

According to a further refinement, the partial electrodes are interconnected in an electrically conductive manner via the carrier; the carrier being connected in an electrically conductive manner to a conducting element via, in particular, exactly one electrode contact element; the conducting element being situated on the substrate or in a further substrate connected to the substrate; the further substrate including, in particular, an integrated circuit. In this manner, it is advantageously possible to pattern the conducting element or the integrated circuit independently of the electrode set-up formed in the functional layer, and in particular, in the further functional layer. In particular, by attaching the partial electrodes to the further substrate including the one integrated circuit, it is advantageously possible to provide a wiring pattern, in order to position a plurality of partial electrodes, which have a comparatively small length, parallelly to the principal direction of extension of the electrode.

According to a further refinement, the electrode is fixed in position relative to the substrate; the further electrode being able to be displaced relative to the substrate, into a motion along a vibration direction; the vibration direction being set, in particular, parallel to the principal plane of extension of the substrate; the vibration direction being set, in particular, perpendicularly to the principal plane of extension of the electrode and/or to the principal plane of extension of the further electrode. In this manner, it is advantageously possible to form the moving electrodes and/or the fixed electrodes to have flow channels, so that the gas molecules from the squeeze-film damping are lead off particularly efficiently out of the gaps between the electrode and the further electrode.

According to a further refinement, the further electrode has the electrode height parallel to the normal direction; the further electrode having a further flow channel extending parallelly to the principal plane of extension of the substrate, completely through the further electrode; the further flow channel having a further channel depth extending parallelly to the normal direction; the further channel depth being less than the electrode height; in particular, the flow channel and the further flow channel being positioned one behind the other in series or side-by-side in a staggered manner, in a projection direction running along the vibration direction. In this manner, it is advantageously possible to reduce the squeeze-film damping forces and simultaneously provide a particularly sturdy and space-saving electrode set-up.

According to a further refinement of the method according to the present invention, in the second production step, the electrode is formed with a principal plane of extension of the electrode, and the further electrode is formed with a principal plane of extension of the further electrode, from the functional layer, as a function of the second patterning mask; the principal plane of extension of the electrode being set parallelly to the normal direction; the principal plane of extension of the further electrode being set parallelly to the normal direction; an electrode height extending in the normal direction being formed at the electrode. In this manner, it is advantageously possible to form the electrode structure to include the electrode, the further electrode, and/or the inertial structure, before the flow channels are positioned on the electrode and/or on the further electrode. This allows a comparatively simple and inexpensive manufacturing method to be provided, in order to be able to manufacture a multitude of micropatterned components simultaneously in a simple manner.

According to a further refinement of the method according to the present invention, in the third production step, a flow channel, which extends completely through the electrode in a direction parallel to the principal plane of extension of the substrate and has a channel depth extending parallelly to the normal direction, is formed from the electrode as a function of the first patterning mask; the channel depth being formed as a function of the second time interval, to be less than the electrode height. In this manner, in order to form the flow channels to have a channel depth less than the electrode height in the electrode and/or further electrode, it is advantageously possible to position a mask on the functional layer having a comparatively smooth upper surface parallel to the principal plane of extension of the substrate, by combining the first mask taking the form of, in particular, an oxide mask and the second mask taking the form of, in particular, a resist mask.

According to a further refinement of the method according to the present invention, in the third production step, the functional layer is provided with a functional layer thickness; in the fourth production step, the flow channel being formed to have the channel depth equal to the functional layer thickness. In particular, the functional layer is situated over a further functional layer in the normal direction, a patterning mask being situated between the further functional layer and the functional layer. In particular, the channel depth of the flow channel is determined by the position of the patterning mask between the functional layer and the further functional layer. In particular, the patterning mask is an etch stop mask, which limits the channel depth of the flow channel during the etching operation. In addition, In this manner, in particular, a plurality of partial electrodes are provided on a carrier formed from the further functional layer. The etch stop layer may be removed in a fifth production step.

Exemplary embodiments of the present invention are represented in the drawings and explained in more detail in the following description.

DETAILED DESCRIPTION

In the different figures, like parts are always denoted by the same reference symbols and are therefore usually labeled or mentioned only once.

Figure 1:
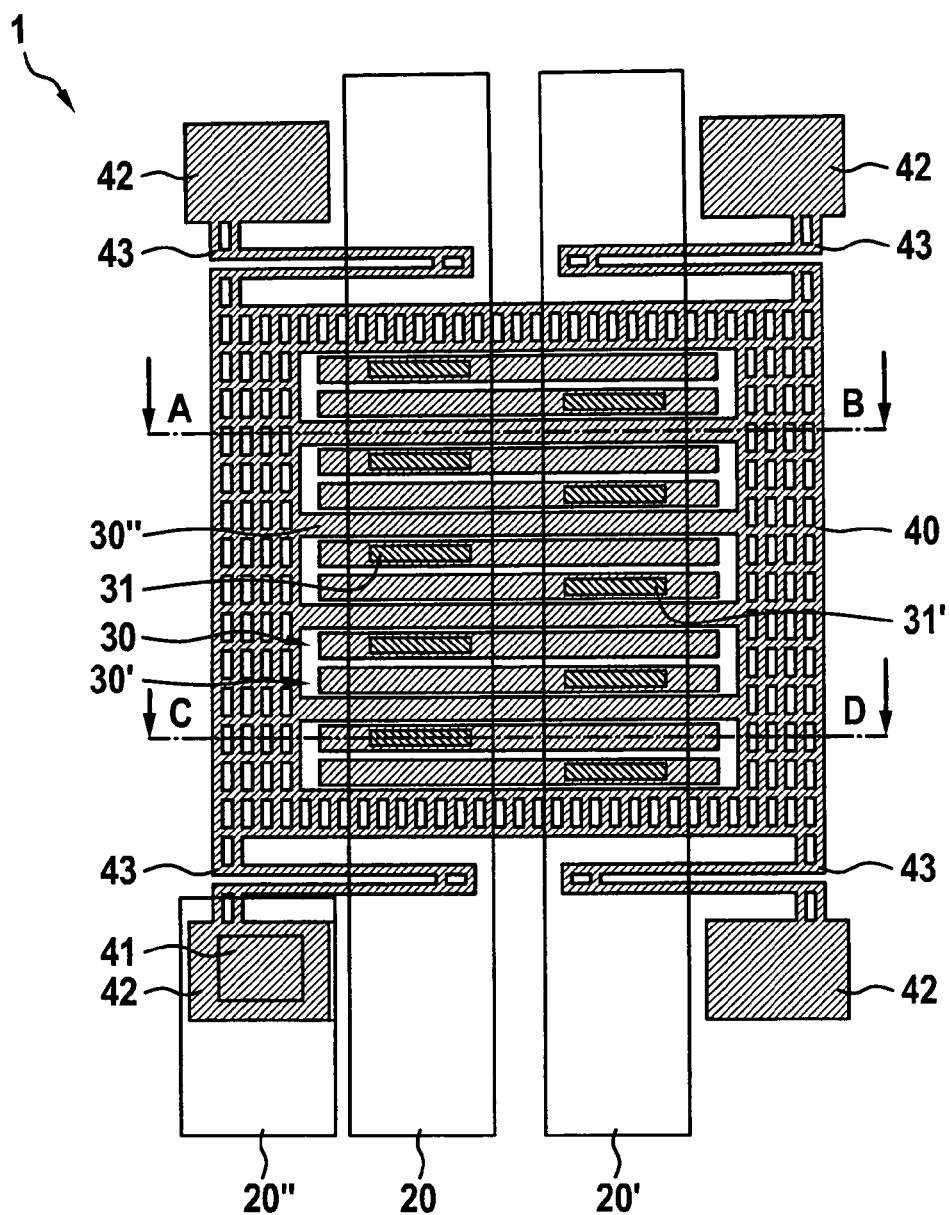
FIG. 1 shows a sectional view of a micropatterned component according to a specific embodiment of the present invention.

A sectional view of a micropatterned component 1 according to a specific embodiment of the present invention is illustrated in FIG. 1. The sectional view shows micropatterned element 1 in a section along a sectional plane parallel to a principal plane of extension 100 of a substrate 10 of micropatterned component 1. Micropatterned component 1, in this case, an acceleration sensor, has an inertial structure deflectable along a vibration direction 102, which is also referred to here as Y-direction 102. In addition, the micropatterned component has an electrode 30 connected to the substrate in a locationally fixed and/or positionally fixed manner. Electrode 30 may have a principal direction of extension of the electrode 301' (see FIG. 6) parallel to an X-direction 101; principal direction of extension of the electrode 301 and/or X-direction 101 being set parallelly to principal plane of extension of the substrate 100 and/or perpendicularly to a principal plane of extension 300 (see, for example, FIG. 3) of electrode 30. Principal plane of extension of the electrode 300 may be positioned perpendicularly to a normal direction 103 perpendicular to principal plane of extension of the substrate 100. The electrode may be connected in an electrically conductive manner, via an electrode contact element 31, to a conducting element 20, in particular, a conductor track 20 deposited on substrate 10. In an alternative specific embodiment, the micropatterned element has a differential electrode 30' formed identically to electrode 30; the differential electrode being connected to a further conducting element 20' in an electrically conductive manner, via a further electrode contact element 31'. A dimension of conductor track 20 and/or of further conductor track 20' parallel to X-direction 101 may be less than 40 micrometers. In a further alternative specific embodiment, a plurality of electrodes 30 and/or differential electrodes 30' are formed in micropatterned component 1.

Inertial structure 40 is connected to a driving mechanism 42, in particular, by several, e.g., four, spring elements 43; driving mechanism 42 being anchored to substrate 10. In particular, driving mechanisms 42, spring elements 43 and/or inertial structure 40 are connected to a drive conducting element 20" in an electrically conductive manner via a drive contact element 41. A further electrode 30" may be situated on inertial structure 40, the further electrode being deflectable together with inertial structure 40.

In a central region, inertial structure 40 has an opening extending, in particular, parallel to principal plane of extension of the substrate 100; the opening being formed to be, in particular, rectangular, in order to surround a plurality of electrodes 30 and/or differential electrodes 30'. Further electrode 30" may have a principal plane of extension of the further electrode 300" (see, for example FIG. 2) parallel to principal plane of extension 300 of electrode 30. In this case, further electrode 30" moves together with inertial structure 40 along vibration direction 102 in such a manner, that further electrode 30" moves between a first end position and a second end position; in the first end position, electrode 30 and further electrode 30" being a shorter distance from one another in a direction parallel to vibration direction 102, than in the second end position.

Figure 2:
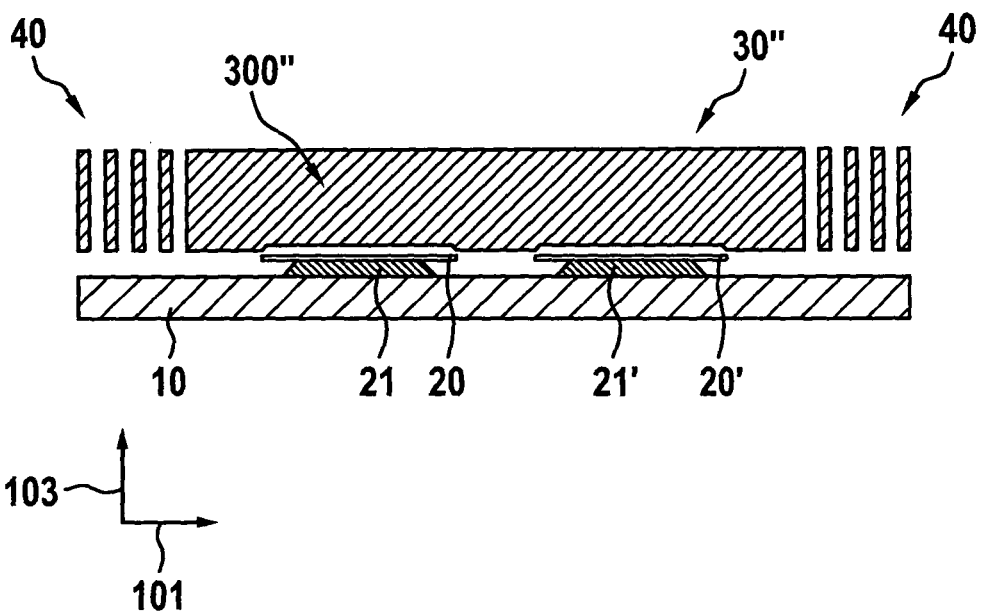
FIGS. 2 and 3 show sectional views of different specific embodiments of an electrode according to a specific embodiment of the present invention.
Figure 3:
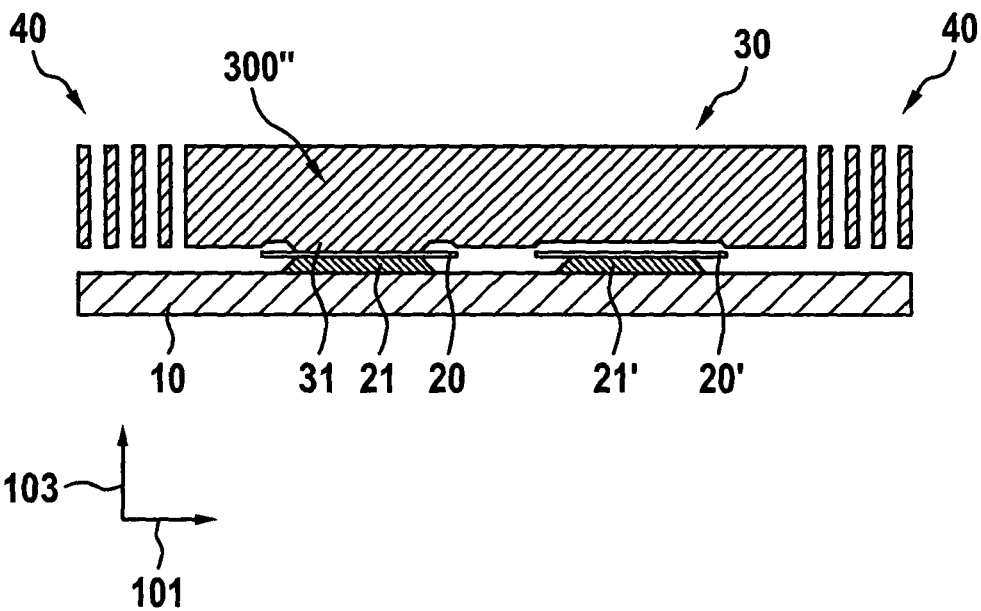

Sectional views of different specific embodiments of an electrode 30, 30', 30" according to a specific embodiment of the present invention are represented in FIGS. 2 and 3. FIG. 2 shows a sectional view of further electrode 30" along sectional direction A-B shown in FIG. 1. The further electrode 30", which has principal plane of extension of the further electrode 300" and extends along X-direction 101 or the principal direction of extension of the further electrode, is illustrated here. Principal plane of extension of the further electrode 300" may be set perpendicularly to principal plane of extension of the substrate 100, the principal direction of extension of the further electrode being positioned parallelly to X-direction 101. Further electrode 30" is rigidly connected to inertial structure 40 and deflectable along vibration direction 102 (see FIG. 1). Further electrode 30" is connected to neither substrate 10, nor conducting element 20 or further conducting element 20'. Conducting element 20 may be joined to substrate 10 by a joining agent, in particular, an oxide, in particular, an oxide layer extending 0.5 to 3 micrometers in normal direction 103. Accordingly, further conducting element 20' may be joined to substrate 10 by a further joining agent 21' which may take the form of a further oxide. In this connection, in particular, conducting element 20 and further conducting element 20' are electrically isolated from one another. FIG. 3 shows a sectional view of electrode 30 along sectional direction C-D shown in FIG. 1. In this case, electrode 30 has a principal plane of extension of the electrode 300 parallel to principal plane of extension of the further electrode 300" and/or perpendicular to principal plane of extension of the substrate 100. In this instance, the electrode is formed in essentially the same manner as further electrode 30". In this case, the difference consists in the electrically conductive electrode contact element 31, via which electrode 30 is connected to conducting element 20 in an electrically conductive manner, and in particular, to substrate 10 in a locationally fixed and/or positionally fixed manner. A differential electrode 30' (not represented in a sectional view and) represented in FIG. 1 is, for example, formed identically to electrode 30, except that differential electrode 30' is not connected in an electrically conductive manner to conducting element 20, but only to further conducting element 20'.

Figure 4:
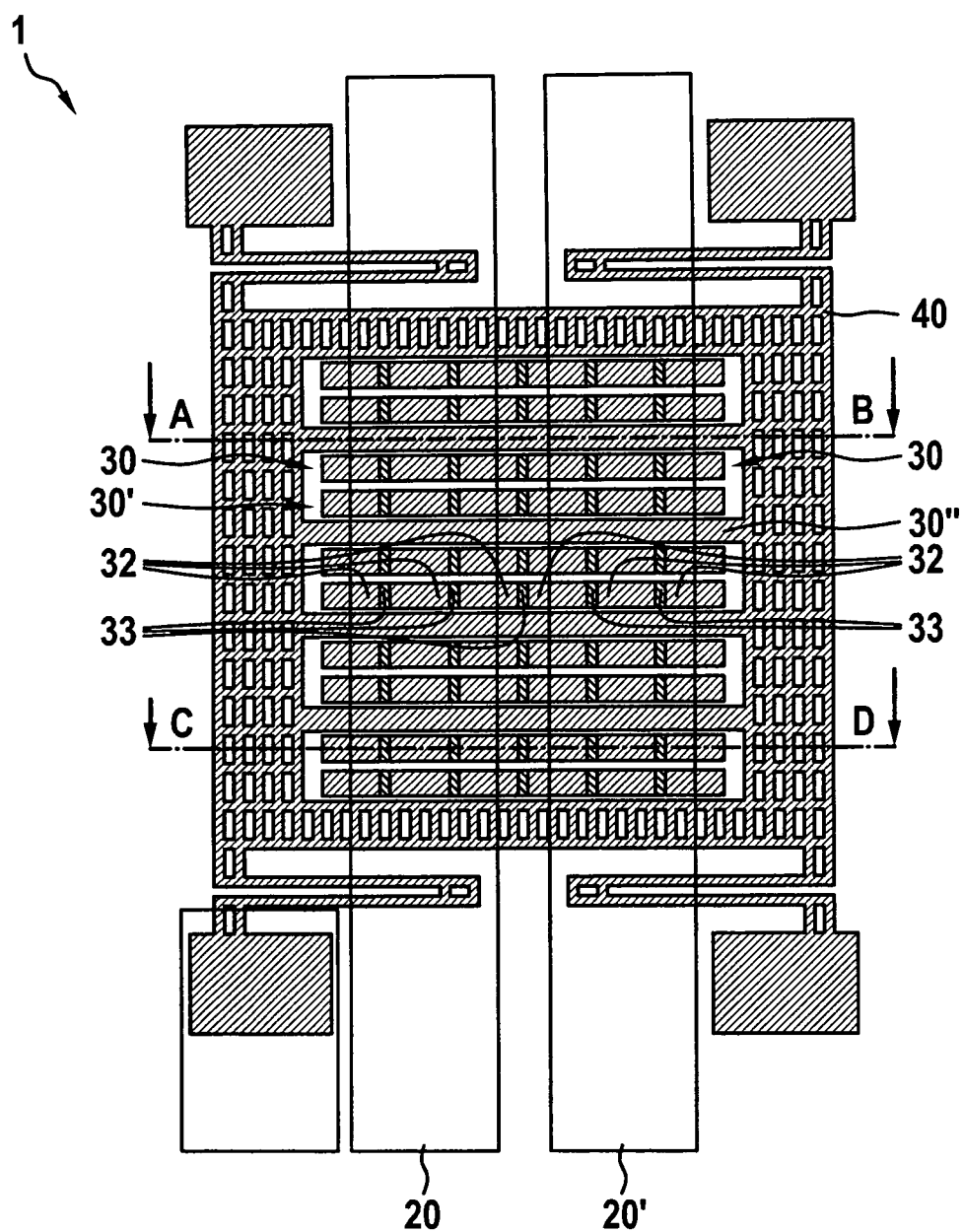
FIG. 4 shows a plan view of a micropatterned component according to a specific embodiment of the present invention.

A sectional view of a micropatterned component 1 according to a specific embodiment of the present invention is illustrated in FIG. 4. Micropatterned component 1 corresponds substantially to the specific embodiment represented in FIG. 1, the difference being that electrode 30, differential electrode 30' and/or further electrode 30" each have several flow channels 33, 33' (see also FIG. 18). In this instance, several flow channels 33, 33' are positioned along the principal direction of extension of the electrode 301 that is parallel to X-direction 101; the principal directions of extension of electrode 30, differential electrode 30' and further electrode 30" being referred to together as principal direction of extension of the electrode 301, all of which are positioned in parallel to one another. In particular, electrode 30, differential electrode 30' and/or the further electrode have a plurality of electrode segments 32, which are spaced apart from one another by flow channels 33, 33' and are also referred to as partial electrodes 32. In this connection, it is advantageously possible for the gas molecules, which emerge due to the squeeze-film damping, to be directed through flow channels 33, 33' during the motion of further electrode 30" relative to the substrate. In so doing, a damping force, which acts upon further electrode 30" and is generated mainly by the squeeze-film damping, is reduced in a particularly advantageous manner. In particular, a plurality of electrodes 30 are interconnected in an electrically conductive manner by conducting element 20, a plurality of differential electrodes 30' are interconnected in an electrically conductive manner by further conducting element 20', and a plurality of further electrodes 30" are interconnected in an electrically conductive manner by inertial structure 40.

Sectional views of different specific embodiments of an electrode 30, 30', 30" according to the present invention are illustrated in FIGS. 5 through 9.

Figure 5:
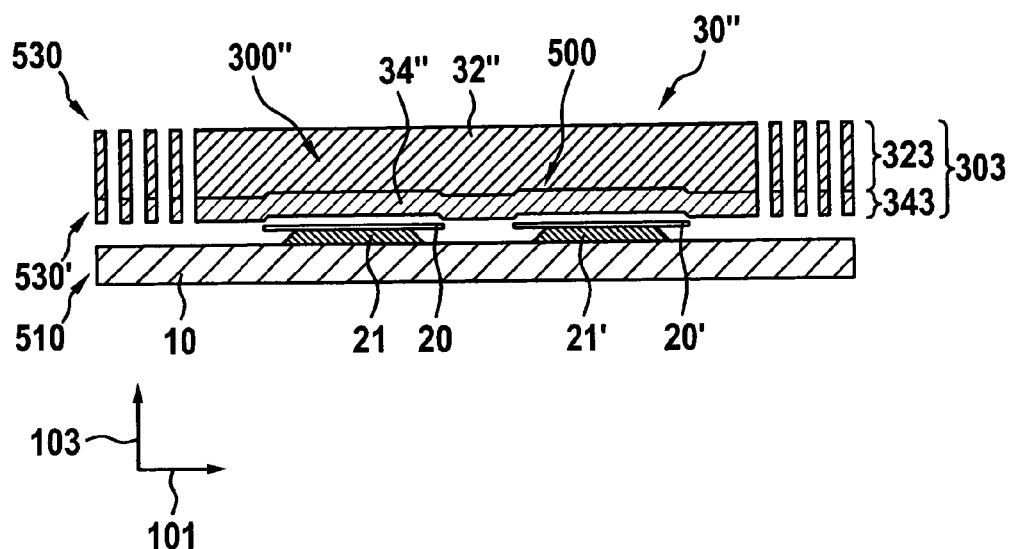
FIGS. 5 through 9 show sectional views of different specific embodiments of an electrode according to the present invention.
Figure 6:
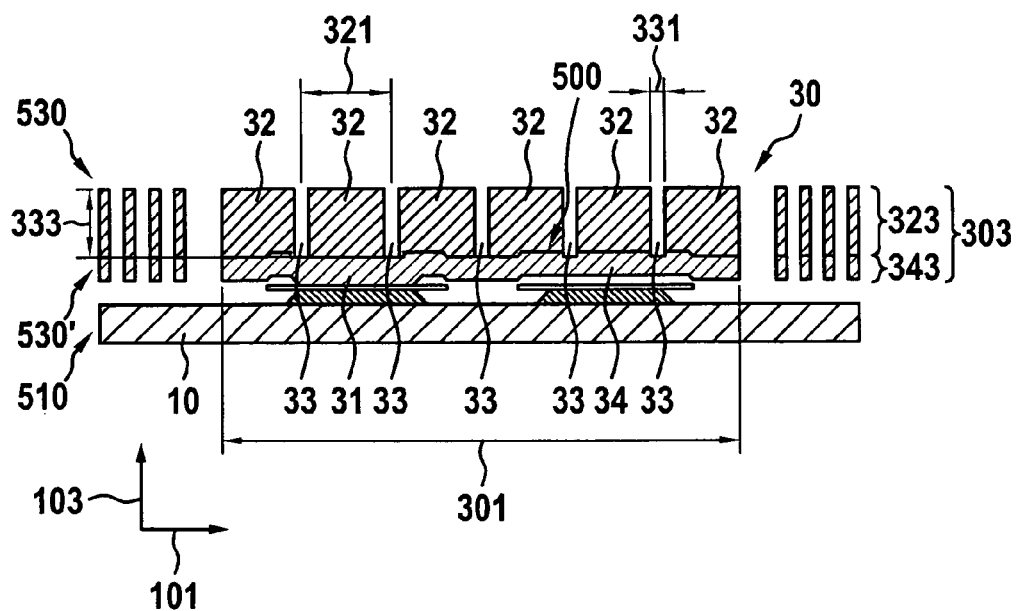

In FIGS. 5 and 6, in each instance, an electrode 30, 30' or further electrode 30" formed from two functional layers 530, 530' is illustrated. In this case, a substrate 10, which includes a substrate layer 510 having a principal plane of extension of the substrate 100, is provided in a first production step. In this instance, in a second production step, in a normal direction 103 perpendicular to principal plane of extension of the substrate 100, a further functional layer 530' is set up, and subsequently, a patterning mask 500, in particular, an etch stop layer 500, is deposited on further functional layer 530'. Here, in a third production step, a functional layer 530 is positioned over further functional layer 530' in normal direction 103, so that in particular, patterning mask 500 is situated between functional layer 530 and further functional layer 530'. In particular, a further patterning mask (not shown) is deposited on functional layer 530. Subsequently, in a fourth production step, an electrode 30, 30' and a further electrode 30" are formed from a functional layer unit 530, 530' forming functional layer 530 and further functional layer 530', as a function of the further patterning mask. In particular, a flow channel 33 is additionally formed in electrode 30, 30' as a function of the further patterning mask, a channel depth 333 of flow channel 33 being formed as a function of patterning mask 500. In this manner, it is advantageously possible to provide an electrode 30, 30' having a carrier 34 and partial electrodes situated on it and/or flow channels 33 having a channel depth equal to a functional layer thickness 323 of functional layer 530. In this manner, in particular, such an electrode 30, 30" or further electrode 30" having comparatively low manufacturing tolerances is provided.

FIG. 5 shows further electrode 30", which substantially corresponds to the specific embodiment illustrated in FIG. 2, the difference being that in this case, further electrode 30" is formed from a functional layer having a functional layer thickness 323, and from a further functional layer 530' having a further functional layer thickness 343. In this connection, in particular, further electrode 30" has one or more further partial electrodes 32" or further electrode segments 32", which are situated on a common, further carrier 34". In particular, further partial electrode 32" is formed from the functional layer and has functional layer thickness 323 as a partial electrode height 323, and further carrier 34" is formed, in particular, from the further functional layer and has further functional layer thickness 343 as a carrier height 343. In particular, the further electrode height 303 here is equal to the sum of further partial electrode height 323 and carrier height 343. Electrode height 303 may be between 10 and 60 micrometers; in particular, the lengths of electrodes 30, 30', 30" parallel to X-direction 101 each being more than 100 micrometers.

FIG. 6 shows electrode 30, which substantially corresponds to the specific embodiment of electrode 30 represented in FIG. 3, the difference being that electrode 30 has several flow channels 33 positioned along principal direction of extension of the electrode 301, and a plurality of partial electrodes 32 are positioned along principal direction of extension of the electrode 301, on a common carrier 34. Corresponding to the further electrode 30" illustrated in FIG. 5, the carrier is formed from further functional layer 530' and has further functional layer thickness 343 as a carrier height 343; partial electrodes 32 being formed from functional layer 530 and having, in each instance, functional layer thickness 323 as a partial electrode height 323. In this case, electrode height 303 corresponds to the electrode height of the further electrode 30" illustrated in FIG. 5. Along principal direction of extension of the electrode, flow channels 33 are spaced apart from one another at a channel spacing 321, which may be, between 5 and 30 micrometers; each flow channel 33 having, in particular, a channel width 331, which may be between 1 and 5 micrometers, extending parallelly to the principal direction of extension of the electrode 301. In addition, flow channels 33 have, in Z-direction 103 or normal direction 103, a channel depth 33, which is, in this case, substantially equal to partial electrode height 323 or functional layer thickness 323. In particular, partial electrodes 32 are interconnected in an electrically conductive manner by electrically conductive carrier 34; carrier 34 being connected to conducting element 20 in an electrically conductive manner via electrode contact element 31. Functional layer thickness 323 is, in particular, approximately 5 to 50 micrometers; further functional layer thickness 343 being, in particular, approximately 1 to 20 micrometers.

Figure 7:
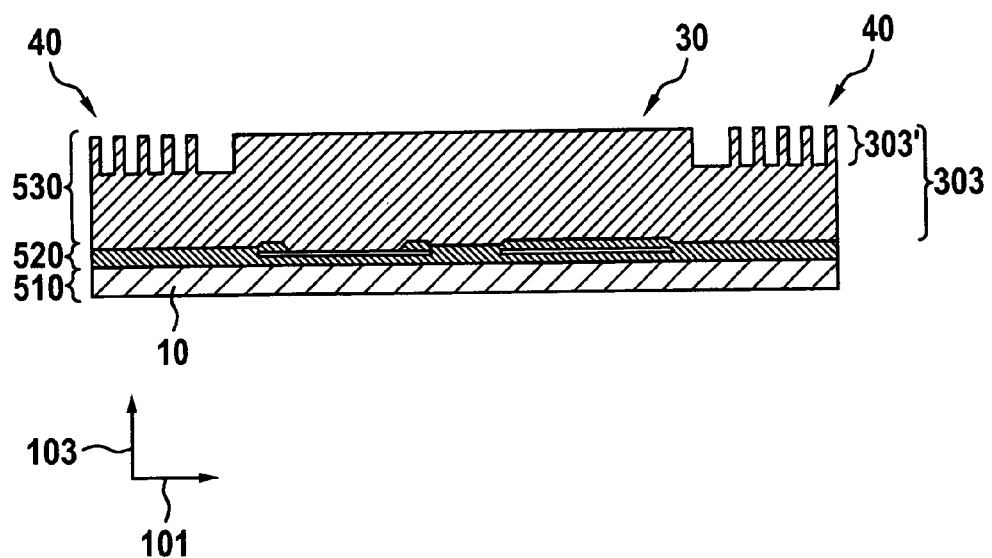
Figure 8:
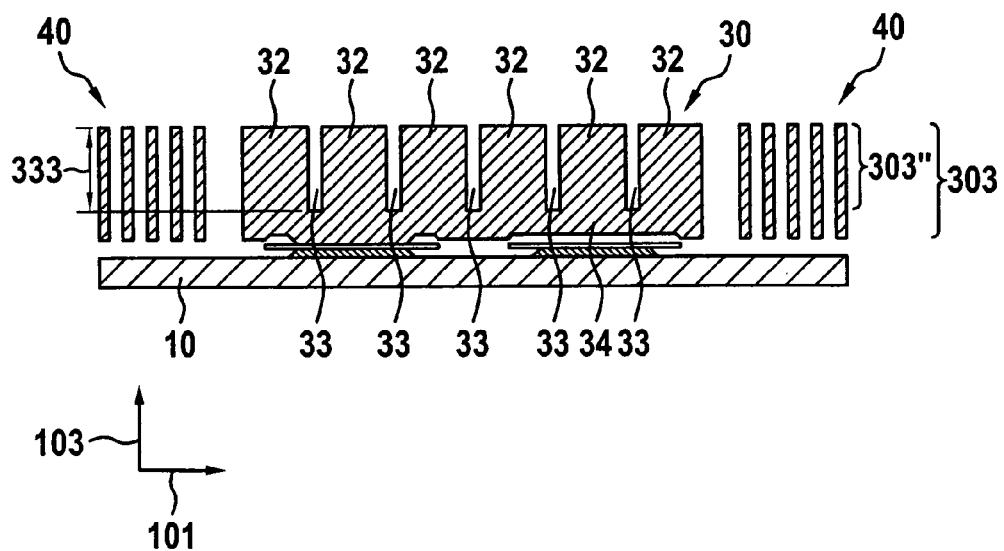

FIG. 7 shows the electrode 30 and inertial structure 40 having first structural depth 303', which are produced from functional layer 530 in the second production step; first structural depth 303' being produced as a function of the duration of the first time interval. Functional layer 530 is connected to the substrate 10 having substrate layer 510, in particular, via the conducting layer 520, in which conducting element 20 and further conducting element 20' are situated. The dimension of conducting layer 520 in the normal direction may be between 0.2 and 1 micrometer. In particular, first structural depth 303' is less than 50%, which may be, less than 30%, of electrode height 303, which is, in this case, functional layer thickness 323. FIG. 8 shows a sectional view of the electrode 30 and inertial structure 40 represented in FIG. 7, after the third production step. Here, flow channels 33 are formed in electrode 30; the flow channels 33 having channel depth 333; channel depth 333 corresponding to a second structural depth 303". Second structural depth 303" is produced as a function of the duration of the second time interval. In addition, partial electrodes 32 are formed after the third production step. In this case, electrode 30 is formed, in particular, in one piece; channel depth 333 being less than electrode height 303. In this instance, inertial structure 40 is completely released.

Figure 9:
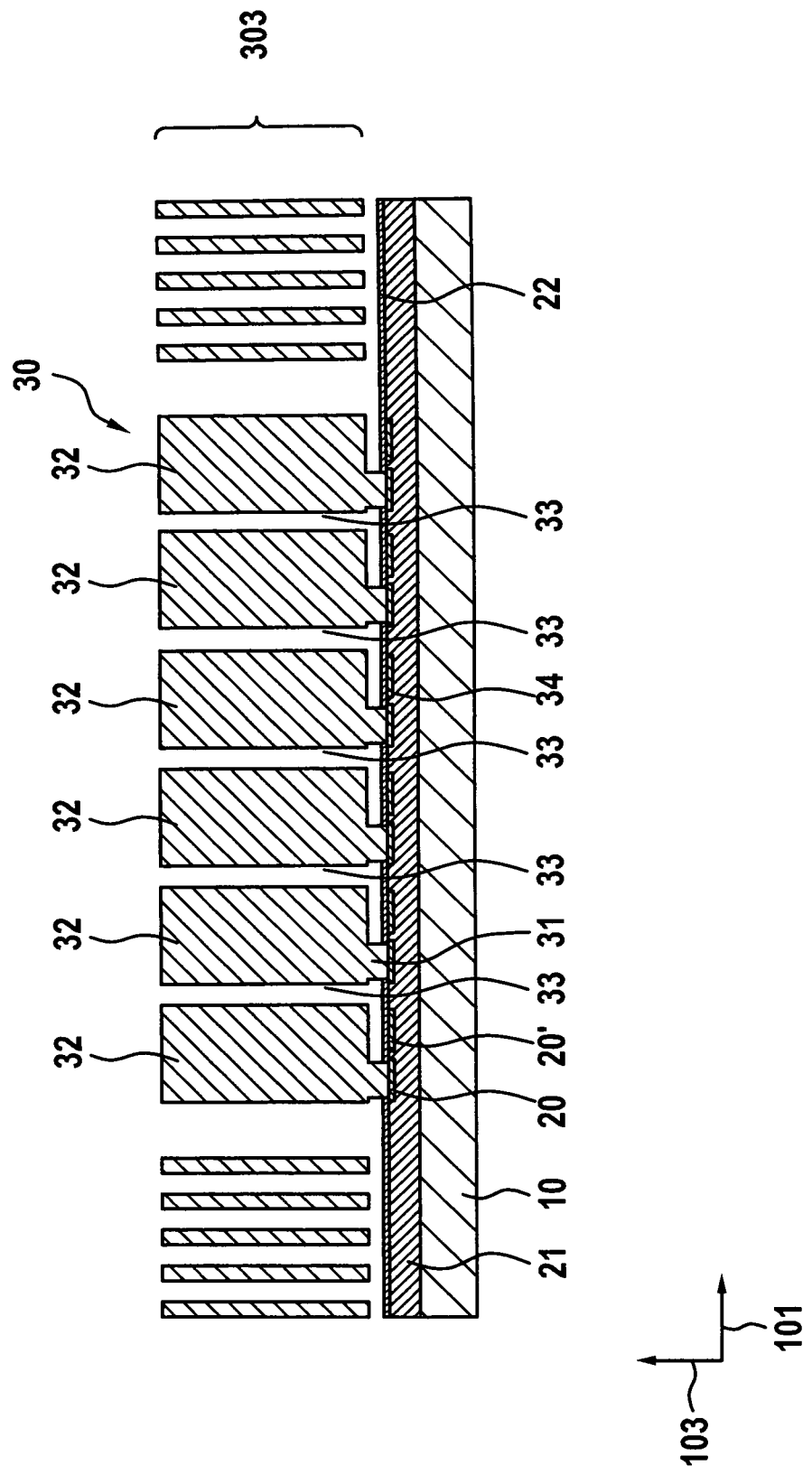
Figure 10:
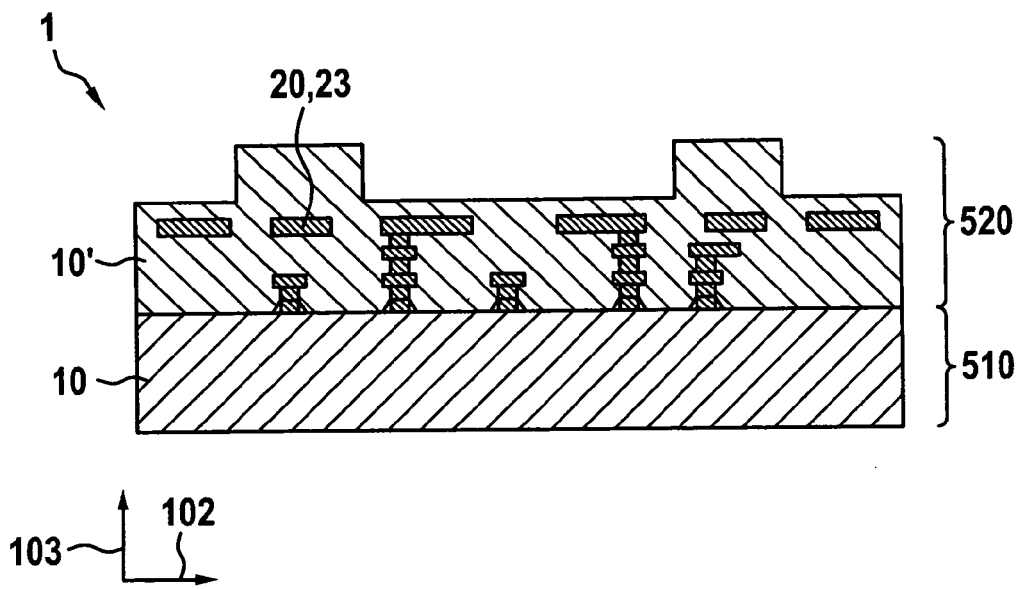
FIGS. 10 through 15 show sectional views of a micropatterned component according to a specific embodiment of the present invention.
Figure 11:
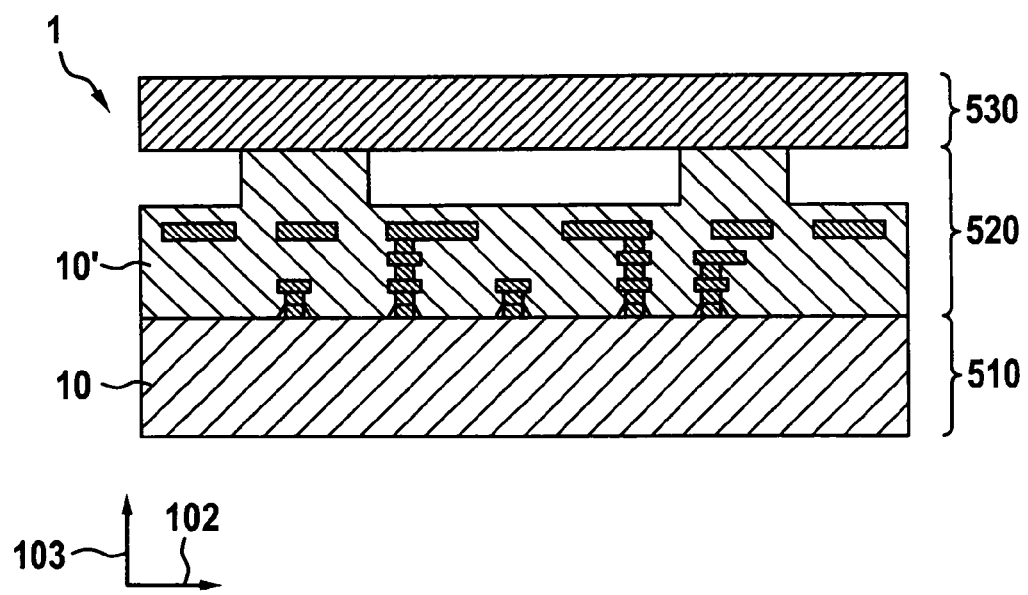
Figure 12:
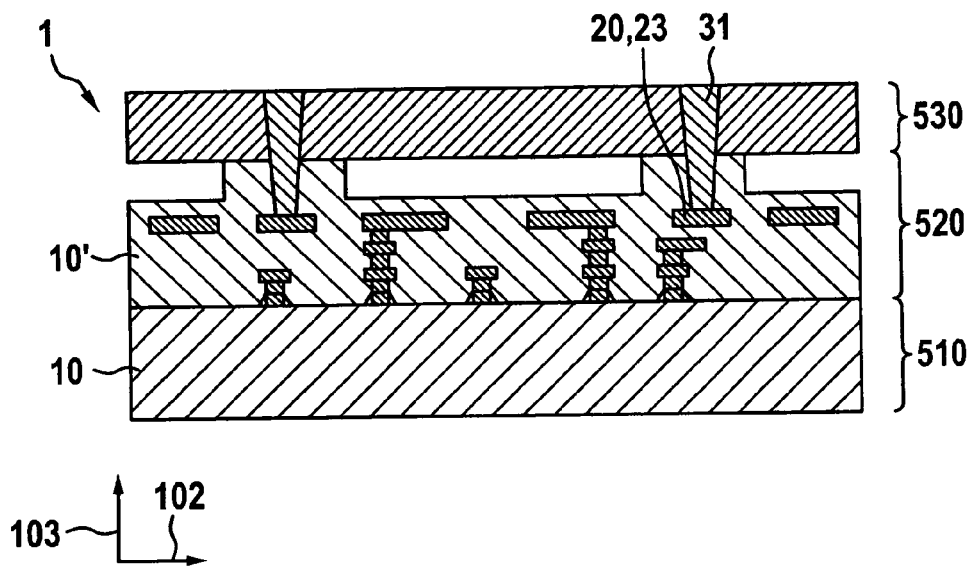
Figure 13:
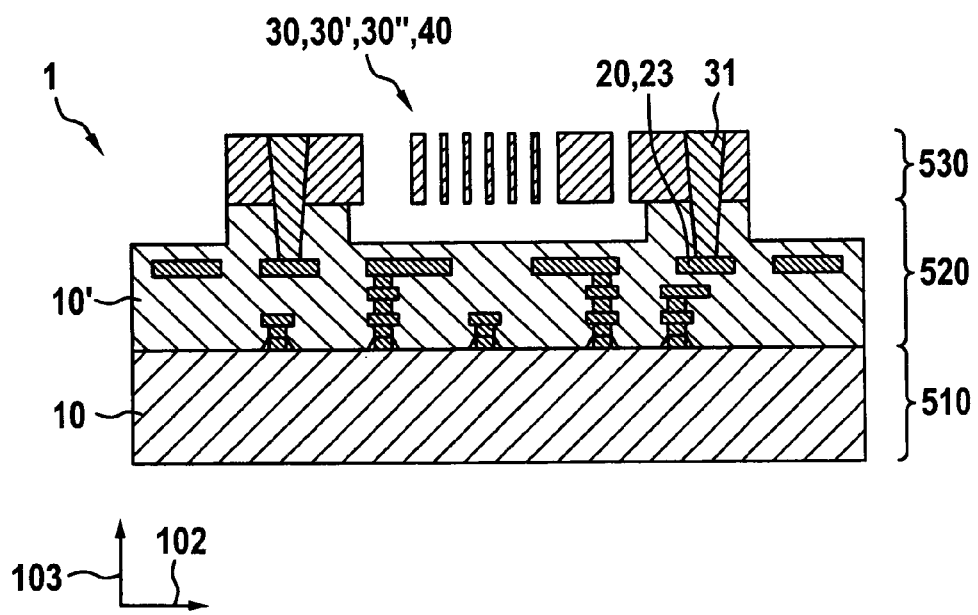
Figure 14:
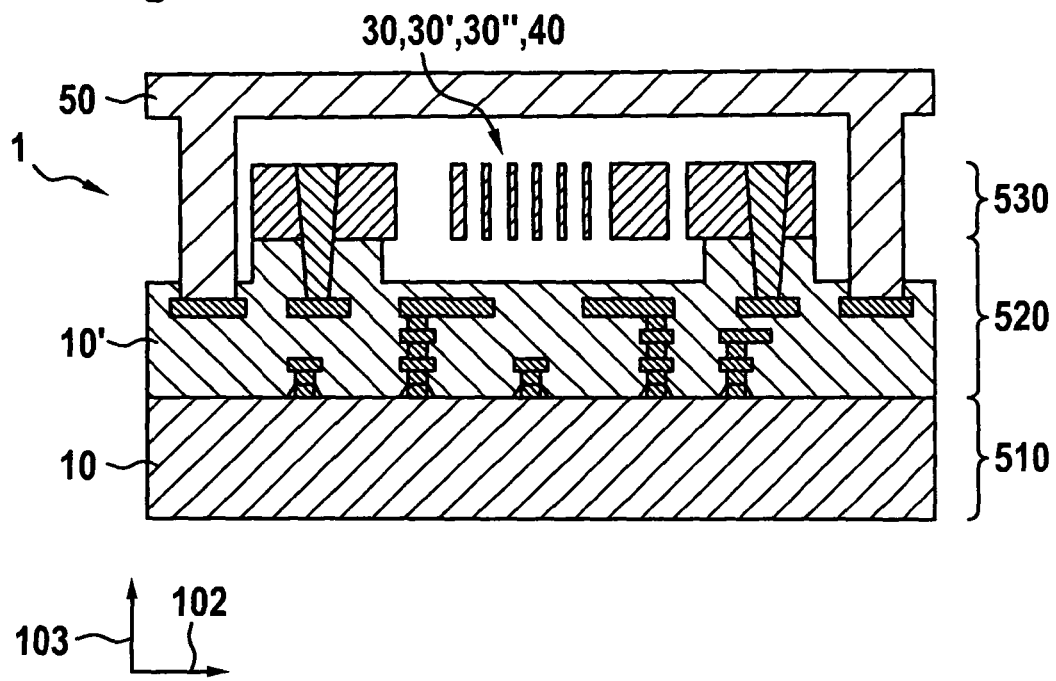

FIG. 9 shows a further specific embodiment of electrode 30 according to the present invention. The specific embodiment substantially corresponds to the above-described specific embodiments of FIGS. 1 through 8, the difference being that in this case, channel depth 333 corresponds to electrode height 303, which means that in particular, several partial electrodes 32 separately attached to substrate 10 are formed from electrode 30. Each of the partial electrodes 32 is connected by conducting element 20 to other partial electrodes 32 in an electrically conductive manner, via electrode contact element 31. Conducting elements 20, 20', in this case, conductor tracks 20, 20', are protected from a gas-phase etch attack by an insulating medium 22 and are produced to be, which may be, between 2 and 10 micrometers wide. The insulating medium is, in particular, a silicon nitride layer, for example, $Si_3N_4$. Insulating medium 22 may be open in normal direction 103 at the areas of electrode contact media 31, which are parallel to principal plane of extension of the substrate 100, and at which, in each instance, an electrode contact element 31 of partial electrodes 32 is situated. In particular, the insulating medium is deposited in the region of the edges and/or of the areas not connected to electrode contact element 31, 31', or is not open parallel to normal direction 103.

Figure 15:
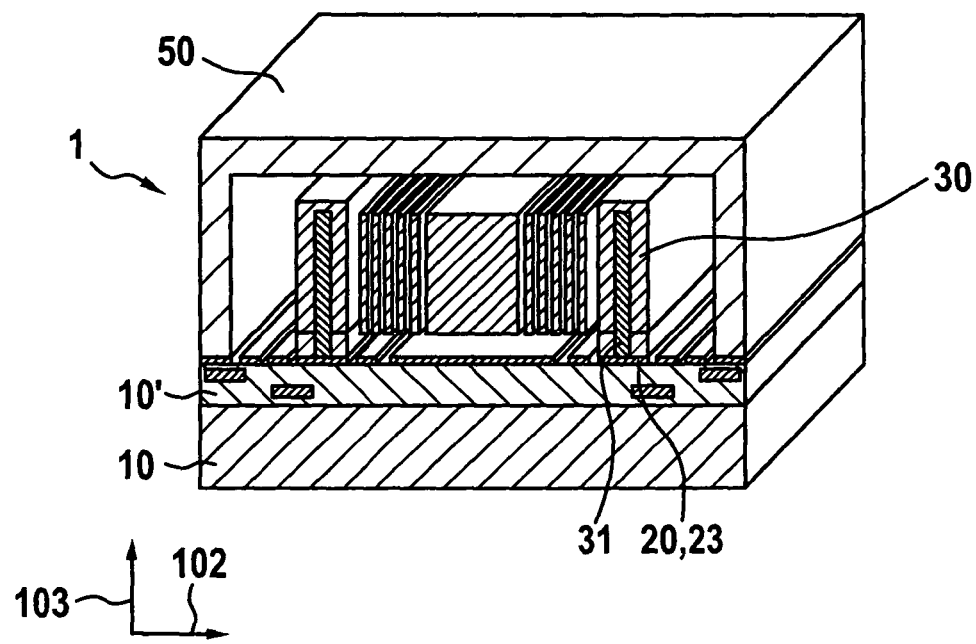

Sectional views of a micropatterned component 1 according to a specific embodiment of the present invention are represented in FIGS. 10 through 15. Here, a manufacturing method for producing a micropatterned component 1 having a layer construction along normal direction 103 is illustrated. The layer construction includes a substrate layer 510 of a substrate 10, and a further substrate 10' of conducting layer 520, which is connected, in particular to substrate layer 510; the further substrate being set up on substrate 10 in normal direction 103 in a first production step. In particular, an integrated circuit, which is formed from a prepatterned wafer (CMOS wafer) and has an evaluation circuit, is situated in conducting layer 520; in particular, conducting elements 20, 20', 20" and/or a conducting structure 23 for connecting, in each instance, portions of conducting elements 20, 20', 20" in an electrically conductive manner, being situated in substrate layer 10'. In particular, an oxide, in particular, an oxide-nitride stack, is subsequently deposited on further substrate 10'. In a second production step, a functional layer 530 is set up over the conducting layer in normal direction 103. In particular, functional layer 530 is provided as an unpatterned microelectromechanical (MEMS) wafer, which is bonded onto the prepatterned oxide-nitride stack using a direct bonding method. Subsequently, the MEMS wafer may be ground to a target thickness in normal direction 103 of 10 to 80 micrometers, which may be, 30 micrometers. Electrode contact elements 31 for contacting functional layer 530 with conducting elements 20, 20', 20" of further substrate layer 10' may be formed in a third production step; in particular, a first trench 31 being set up for depositing electrode contact elements 31 between the MEMS wafer and the integrated circuit; the electrode contact elements taking the form of contact holes 31. A metal, in particular, tungsten, is deposited in first trench 31, in order to produce, in particular, an electrically conductive contact between the MEMS and a conductor track 20 of further substrate 10'; the filling being, in particular, complete or partial. A tungsten layer may be patterned and/or situated on an upper surface of functional layer 530 parallel to principal plane of extension of the substrate 100. In a fourth production step, an electrode structure 30, 30', 30", 40, which includes, in particular, an electrode 30, a differential electrode 30', a further electrode 30" and/or an inertial structure 40, is released in functional layer 530. In this connection, in particular, a second trench for patterning the MEMS layer or electrode structure is produced; the electrode structure being released and separated regions being electrically isolated. In a fifth production step, in particular, a cover element is mounted on the conducting layer. A cover 50 formed from a cover wafer may be bonded to conducting layer 520 or to the (ASIC) wafer having the integrated circuit, or to the MEMS wafer with the aid of, in particular, eutectic bonding, for example, using aluminum on the ASIC wafer and germanium on the cover wafer. Electrode structure 30, 30', 30", 40 may be situated in a hollow space hermetically sealed and enclosed by cover element 50 and further substrate 10'. A low pressure of, for example, 0.3 to 3 millibars may be generated in the hollow space. FIG. 15 shows a spatial sectional view of the micropatterned element 1 represented in FIG. 14. In this manner, it is advantageously possible to connect very small contact holes 31 or electrode contact elements 31 to conducting elements 20, 20'; conducting elements 20, 20' being able to be patterned within the integrated circuit in a particularly simple and flexible manner.

Figure 16:
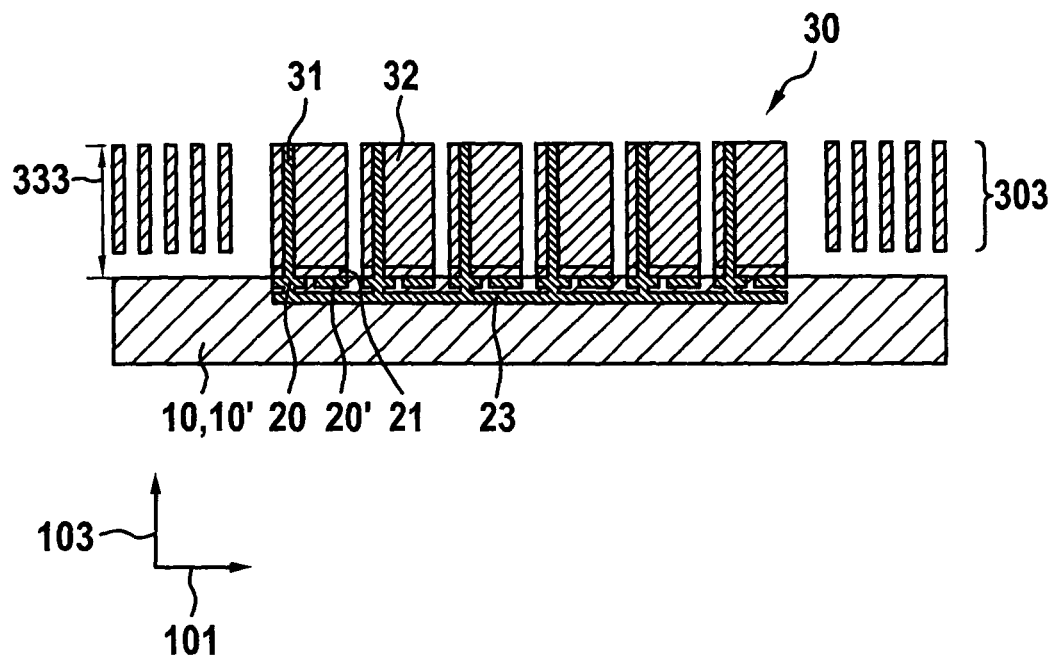
FIGS. 16 through 17 show sectional views of different specific embodiments of an electrode according to a specific embodiment of the present invention.
Figure 17:
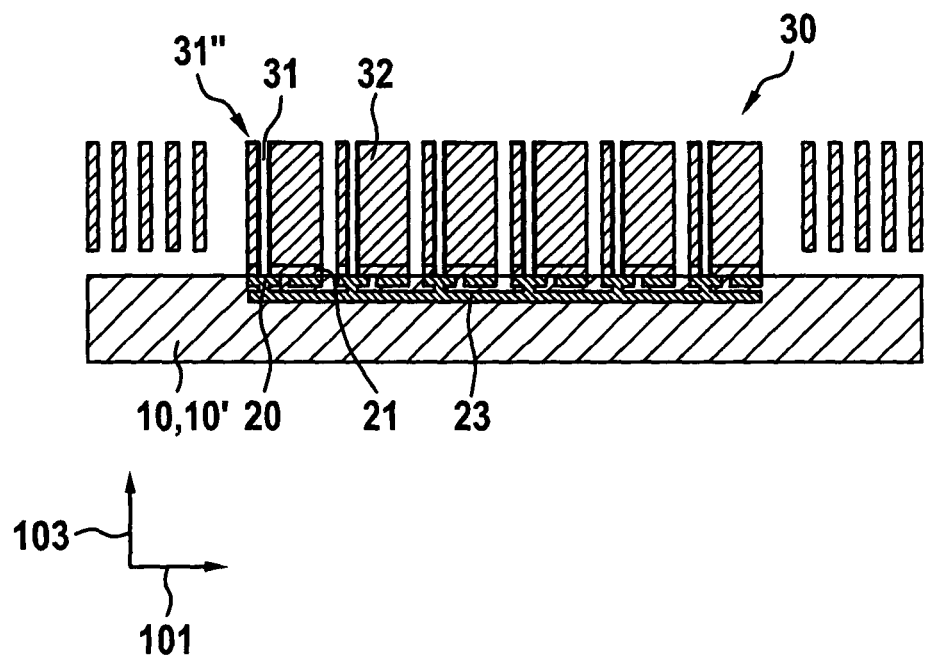

Sectional views of different specific embodiments of an electrode 30, 30', 30" according to a specific embodiment of the present invention are represented in FIGS. 16 to 17. Electrode 30 substantially corresponds to the specific embodiment described in FIG. 9; the difference being that partial electrodes 32 are situated on a further substrate 10' having an integrated circuit. In particular, conducting elements 20, 20' are situated in the integrated circuit. Partial electrodes 32 are interconnected in an electrically conductive manner by electrode contact elements 31 taking the form of tungsten plugs; the tungsten plugs being produced, in particular, by filling up a conducting channel 31" with an electrically conductive material.

Figure 18:
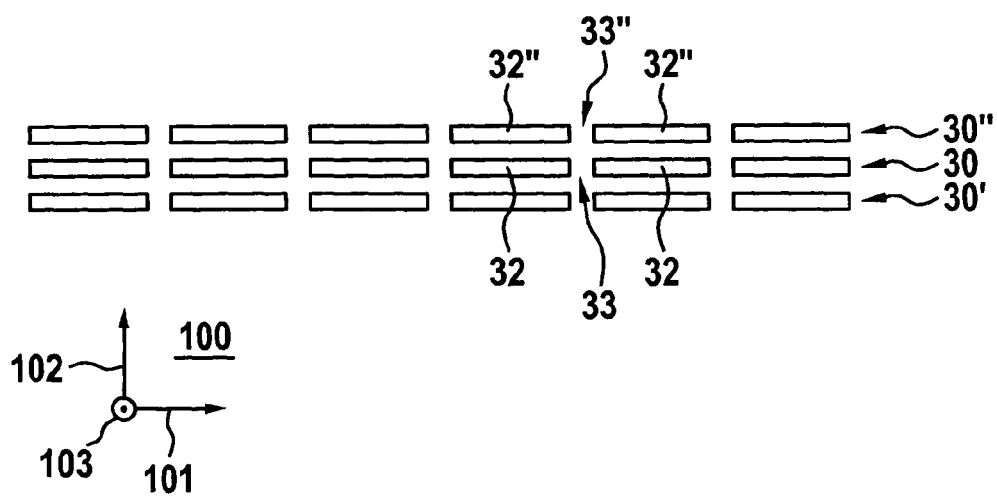
FIGS. 18 and 19 show plan views of different specific embodiments of a set-up of the flow channels of an electrode according to the present invention.
Figure 19:
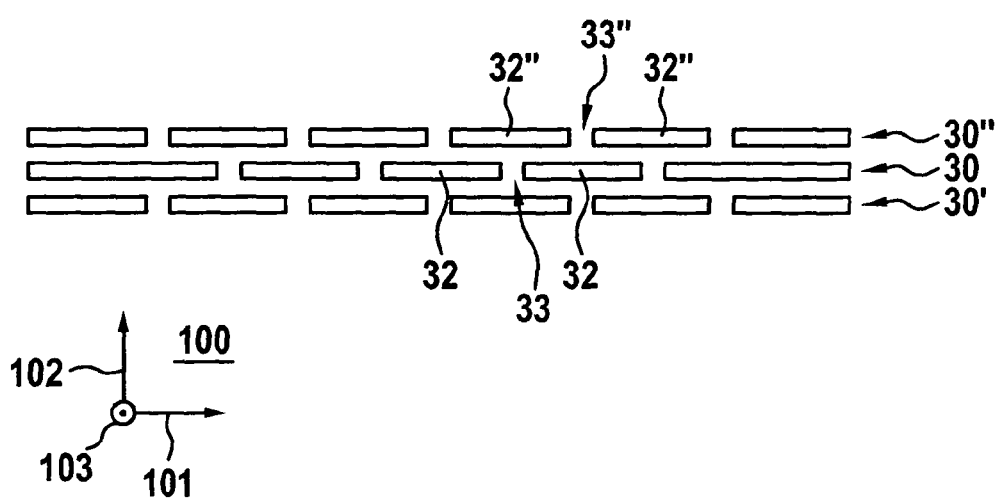

Plan views of different specific embodiments of a set-up of flow channels 33, 33" of an electrode 30, 30', 30" according to the present invention are represented in FIGS. 18 and 19. In this case, in a projection direction 102 running along vibration direction 102, flow channel 33 and further flow channel 33" are positioned one behind the other in series (FIG. 18) or side-by-side in a staggered manner (FIG. 19).

What is claimed is:

1. A micropatterned component for measuring at least one of an acceleration and a yaw rate, comprising:
    a substrate having a principal plane of extension of the substrate;
    an electrode; and
    a further electrode;
    wherein the electrode has a principal plane of extension of the electrode and the further electrode has a principal plane of extension of the further electrode,
    wherein the principal plane of extension of the electrode is positioned parallelly to a normal direction perpendicular to the principal plane of extension of the substrate,
    wherein the principal plane of extension of the further electrode is set parallel to the normal direction,
    wherein the electrode has an electrode height extending in the normal direction,
    wherein the electrode has a flow channel extending completely through the electrode in a direction parallel to the principal plane of extension of the substrate,
    wherein the flow channel has a channel depth extending parallelly to the normal direction, and
    wherein the channel depth is less than the electrode height.

2. The micropatterned component of claim 1, wherein the channel depth is between 60% and 95% of the electrode height.

3. The micromechanical component of claim 1, wherein the electrode has a principal direction of extension of the electrode, parallel to the principal plane of extension of the electrode and parallel to the principal plane of extension of the substrate, wherein the electrode has several flow channels situated along the principal direction of extension of the electrode, wherein the several flow channels have a channel spacing, and wherein the channel spacing is less than the electrode height.

4. The micromechanical component of claim 1, wherein the electrode has a plurality of partial electrodes spaced apart from one another by the several flow channels, wherein the partial electrodes are situated on a common carrier, wherein the electrode is formed from a functional layer, and wherein the carrier is formed from a further functional layer connected to the functional layer.

5. The micromechanical component of claim 1, wherein the partial electrodes are interconnected in an electrically conductive manner via the carrier, which is connected in an electrically conductive manner to a conducting element via one electrode contact element, wherein the conducting element is situated on the substrate or situated in a further substrate connected to the substrate, and wherein the further substrate includes an integrated circuit.

6. The micromechanical component of claim 1, wherein the electrode is fixed in position relative to the substrate, wherein the further electrode is displaceable relative to the substrate, into a motion along a vibration direction, wherein the vibration direction is set parallel to the principal plane of extension of the substrate, and wherein the vibration direction is set perpendicularly to at least one of the principal plane of extension of the electrode and/or to the principal plane of extension of the further electrode.

7. The micromechanical component of claim 1, wherein the further electrode has the electrode height parallel to the normal direction, wherein the further electrode has a further flow channel extending completely through the further electrode, in parallel with the principal plane of extension of the substrate, wherein the further flow channel has a further channel depth extending parallelly to the normal direction, wherein the further channel depth is less than the electrode height, and wherein the flow channel and the further flow channel are positioned one behind the other in series, or side-by-side in a staggered manner, in a projection direction running along the vibration direction.

8. The micropatterned component of claim 1, wherein the channel depth is between 70% and 90% of the electrode height.

9. The micropatterned component of claim 1, wherein the channel depth is approximately 80% of the electrode height.

* * * * *